United States Patent [19]

Evans et al.

[11] Patent Number: 4,732,865

[45] Date of Patent: Mar. 22, 1988

[54] SELF-ALIGNED INTERNAL MOBILE ION GETTER FOR MULTI-LAYER METALLIZATION ON INTEGRATED CIRCUITS

[75] Inventors: David R. Evans, Aloha; James S. Flores; Susan S. Dottarar, both of Beaverton, all of Oreg.

[73] Assignee: Tektronix, Inc., Beaverton, Oreg.

[21] Appl. No.: 915,303

[22] Filed: Oct. 3, 1986

[51] Int. Cl.$^4$ ............... H01L 21/385; H01L 21/441; H01L 21/467
[52] U.S. Cl. ........................ 437/12; 437/192
[58] Field of Search ............... 148/DIG. 60, DIG. 61; 357/73; 437/12, 192

[56] References Cited

U.S. PATENT DOCUMENTS

| | | | |
|---|---|---|---|
| 4,477,310 | 10/1984 | Park et al. | 156/643 |
| 4,485,550 | 12/1984 | Koeneke et al. | 29/571 |
| 4,589,928 | 5/1986 | Dalton et al. | 148/1.5 |
| 4,642,878 | 2/1987 | Maeda | 29/571 |

OTHER PUBLICATIONS

Vossen, VLSI Metallization Problems and Trends, Semiconductor International (Sep. 1981), pp. 91–99.
SZE, Ed, *VLSI Technology*, 1983, pp. 360–373.
Summers, Process for Two-Layer Gold IC Metallization, Solid State Tech. (Dec. 1983), pp. 137–141.
Kaplan et al., "Phosphosilicate Glass Stabilization of MOS Structures", J. Electrochem. Soc: Solid State Science, V. 118, No. 10 (1971), pp. 1649–1653.

*Primary Examiner*—Olik Chaudhuri
*Attorney, Agent, or Firm*—William S. Lovell; Alexander C. Johnson, Jr.

[57] ABSTRACT

A multi-layer metallization method and structure that permits the use of sodium-ion contaminated titanium-tungsten (Ti:W) as a barrier metal with gold conductor metal on a silicon substrate, without significant degradation of device characteristics. After depositing the barrier and conductor metal layers, a layer of phosphorous-silicate glass (PSG) is anisotropically-etched to expose the field oxide and top surface of the conductor metal but leave PSG layer on each sidewall of the metallization structure. The circuit is then annealed at 400° C. for 30 minutes. Then, an adhesion layer ($Si_3N_4$) and an insulative layer ($SiO_2$) are deposited over the metallization structure and field oxide, with the adhesion layer in contact with the top surface of the conductor metal and the gettering composition. The resultant circuit has a field threshold voltage shift comparable to devices made without a metal-ion-contaminated barrier layer and the resultant structure reliably retains the PSG layers in contact with the metallization sidewalls.

15 Claims, 4 Drawing Figures

SELF-ALIGNED INTERNAL MOBILE ION GETTER FOR MULTI-LAYER METALLIZATION ON INTEGRATED CIRCUITS

BACKGROUND OF THE INVENTION

This invention relates generally to a method of making and a structure of a gate and interconnect metallization for an integrated circuit device and more particularly to a multi-layer metallization method and structure.

Multi-layer metallization structures are discussed in J. L. Vossen, "VLSI Metallization Problems and Trends," Semiconductor International, September 1981, pages 91–99 and in S. M. Sze, "VLSI Technology," 1983, pages 360–372. Many variations have been suggested. One multi-layer metallization structure of particular interest conventionally comprises a conductor of a noble metal, such as gold, with a barrier layer of a refractory metal, such as titanium-tungsten, deposited between the conductor metal and the substrate surface. The purpose of barrier metallization is to inhibit diffusion of the gold into the substrate, typically silicon, and formation of an eutectic that impairs the semiconductive properties of the substrate material. Conventional metallization processes include forming an oxide (SiO$_2$) layer on the silicon substrate, forming contact openings in the oxide layer over semiconductor devices formed in the substrate, sputter-depositing a layer of titanium-tungsten onto the substrate surface, patterning the barrier metallization, and gold plating the conductor metal onto the barrier metal. An example of such processes is detailed in D. Summers, "A Process for Two-Layer Gold IC Metallization," Solid State Technology, pages 137–141, December 1983.

Field threshold voltage is the static voltage required between an electrode contacting the field oxide and the underlying semiconductor substrate (i.e., across the field oxide) to invert the underlying region of a doped semiconductor substrate from one type (e.g., p-type) to the other (e.g., n-type). In MOS technology this corresponds to gate threshold voltage, $V_t$. One problem with gate metallization structures as described above is that the circuit devices frequently exhibit a large field threshold voltage shift. The measurement of field threshold voltage shift is conventionally expressed in terms of a shift of flat band voltage in millivolts per thousand angstroms of field oxide thickness. A typical inversion voltage for a bipolar integrated circuit fabricated on a doped silicon substrate (sheet resistance of about 4,000 ohms per square) is in the range of 20–25 volts for a field oxide thickness of about 1 micron. In cases of mobile sodium ion contamination, within the field oxide, this voltage can shift downward 10 volts or more (1 volt/1000 Å), causing device isolation within the substrate to fail. An acceptable amount of voltage shift is normally 5 volts or less (under 500 millivolts/1000 Å of field oxide thickness).

It has been suggested that a cause of this problem is the introduction of sodium ions (Na+) into the field oxide from the barrier metal. Titanium-tungsten targets conventionally used in sputter-depositing the barrier metal layer onto the substrate surface are believed to be commonly contaminated with large amounts of sodium. We have demonstrated experimentally that the titanium-tungsten barrier metal is a major contributor of the field oxide sodium ions.

It has been proposed to getter the sodium ions with a gettering material, such as phosphorus silicate glass (PSG). PSG has been commonly used as an interlevel dielectric with aluminum and aluminum-alloy metallizations on silicon. One proposal suggested depositing a 1000 Å PSG layer after deposition of insulative nitride and oxide layers over the metallization structure, but the nitride layer proved to be an effective barrier to sodium diffusion. Consequently, very long anneal times (more than seven hours at 400° C.) proved to be ineffective for gettering using this arrangement.

Another problem with this proposal is the difficulty of obtaining adequate adhesion of the PSG layer to other materials in the device structure. In particular, adhesion of PSG to gold is rather poor, leading to delamination problems. To avoid such problems, D. Summers (p. 138) recommends using an adhesion layer of silicon nitride between such materials. Doing so, however, effectively precludes using PSG for gettering sodium ions from the barrier metal and field oxide.

Accordingly, a need remains for a multi-layer metallization structure and method that will permit the use of a barrier metal such as titanium-tungsten that may be contaminated with metal ions, particularly sodium, without degrading operating characteristics of the integrated circuit.

SUMMARY OF THE INVENTION

One object of the invention is to improve upon prior methods of metallization that employ a barrier metal in contact with the substrate surface.

A second object of the invention is to minimize the effects on integrated circuit operating characteristics, particularly field threshold voltage shift, that occur in connection with the use of barrier metal layers.

Another object of the invention is to minimize further complication of integrated circuit fabrication processes, particularly avoiding additional photolithography steps.

A further object of the invention is to provide a metallization method that is compatible with the conventional integrated circuit fabrication processes.

The invention provides a multilayer metallization method and structure for an integrated circuit that permits the use of a metal-ion contaminated refractory metal, e.g., titanium-tungsten (Ti:W) with sodium ions (Na+), without significant degradation of device characteristics. After depositing the barrier and conductor (preferably gold) metal layers, a layer of a gettering composition, preferably phosphorous silicate glass, is deposited over the entire metallization structure and field oxide layer. The gettering composition is then selectively removed, e.g., by reactive ion etching, to expose the field oxide and top surface of the conductor metal, while leaving a gettering composition layer on each sidewall of the metallization structure. The circuit is then annealed at a temperature and for a duration sufficient to mobilize and transfer metal ions from the barrier metal and adjoining field oxide-substrate regions into the gettering composition. Then an adhesion layer and an insulative layer (e.g., silicon dioxide) are deposited over the metallization structure and field oxide, with the adhesion layer in the exposed top surface of the conductor metal and the gettering composition.

The resultant circuit has electrical characteristics, such as field threshold voltage shift, comparable to devices made without a metal-ion-contaminated barrier layer. Moreover, the resultant structure retains the gettering composition layers in contact with the metallization sidewalls notwithstanding poor adhesion between them. Although sidewall structures have previously been used in integrated circuits (Park, et al., U.S. Pat. No. 4,477,310) such structures are not of compositions used in the present invention and do not pertain to the problems, objectives and solutions of the present invention.

The foregoing and other objects, features, and advantages of the invention will become more readily apparent from the following detailed description which proceeds with reference to the accompanying drawings.

DETAILED DESCRIPTION

Figure 1:
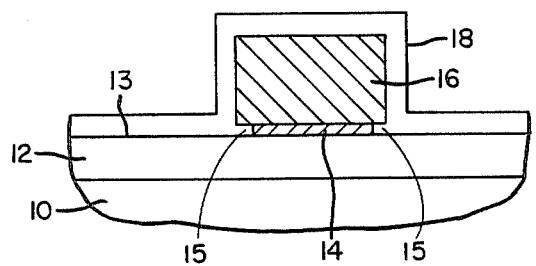
FIG. 1 is a cross-sectional view of a field portion of an integrated circuit substrate showing the initial steps of metallization according to the invention.

Referring to FIG. 1, an integrated circuit is conventionally formed on a silicon substrate 10 with a field oxide ($SiO_2$) layer 12 convering the substrate in field areas between circuit device regions (not shown) implanted or diffused into the silicon. Layer 12 serves to insulate the semiconductive material 10 from conductors to be formed on its surface 13 as described below. Contact openings (not shown) for the conductors to contact the substrate material 10 are formed in the field oxide layer 12 in positions aligned with gate, source and drain (or base, collector, and emitter) regions of each circuit device. The field oxide layer is suitably of a thickness of 2,000-9,000 Å and can be formed by either thermal oxidation or other known $SiO_2$ deposition techniques.

Next, a layer 14 of barrier metal is deposited onto substrate surface 13. Various refractory metal compositions containing titanium-tungsten (Ti:W) and other metals in varying proportions are conventionally used. The barrier metal is suitably deposited to a thickness of about 1,250 Å. The barrier metal is sputter-deposited onto the substrate surface from a sputtering target formed of the desired titanium-tungsten composition. Such targets conventionally contain minute amounts of contaminant metal ions, such as sodium, that are also transferred to the deposition layer by the sputtering process. In accordance with the invention, such targets can be used. The barrier metal need not be devoid of contaminant metals, but can contain such amounts of contaminant metal ions including sodium as are found in commercially available titanium-tungsten barrier metal targets (e.g., sodium concentrations of 3-10 parts per million per manufacturer's specifications).

Next, the barrier metal layer is patterned using conventional photolithographic techniques. Then, a conductor metal layer 16 is deposited by electroplating onto the barrier metal layer 14. The electroplated metal is deposited only in the open areas (i.e., non-photoresist-covered) of the patterned substrate. The plated metal thus defines a predetermined network of contacts and interconnects between the various devices in the integrated circuit. The photoresist is then stripped and the wafer is etched to remove the barrier metal from the field regions between the plated conductor metal. The etching step etches away the edges of the barrier metal layer 14 to produce a slight recess 15 beneath the sidewalls of the conductor metal layer 16. Various metals can be used for the conductor metal but a noble metal, such as gold, is preferred. The gold layer is deposited to a thickness of about 8,000 Å.

After metallization, a layer 18 of a gettering composition is deposited over the entire substrate, including the sidewalls of the barrier and conductor metal layers 14, 16. The gettering composition is selected for its ability to getter undesired contaminant ions that are present in the barrier metal deposited in layer 14. For the most prevalent undesired contaminant metal ions, namely sodium, the preferred gettering composition is 4% to 8%-by-weight phosphorous-silicate glass (PSG). Other compositions, such as arsenosilicate glass may also be suitable for this purpose. The phosphorous-silicate glass is chemical vapor deposited onto the substrate and metallization layers. Since chemical vapor deposition is not a line-of-sight deposition process, it provides relatively uniform coverage of the exposed surfaces and some deposition of PSG into the recesses 15 in contact with the sidewalls of the barrier metal layer 14. Layer 18 is deposited to a thickness of about 1,000 Å.

Figure 2:
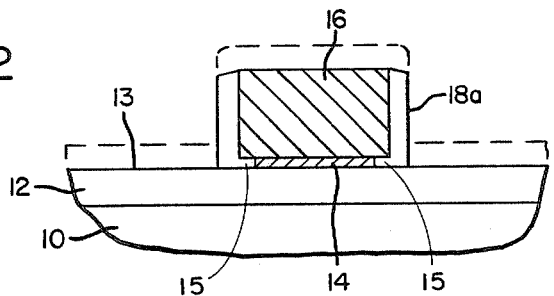
FIG. 2 shows the structure of FIG. 1 after anisotropic etching of the layer of gettering material.

Next, referring to FIG. 2, gettering composition layer 18 is etched anisotropically using fluorocarbon-based reactive-ion etching (RIE) to remove portions of such layer that extend parallel to the substrate surface. This is done to selectively expose the top surface of the conductor metal 16 and the surface 13 of the field oxide layer while leaving sidewall layers 18a on both sides of the metallization structure 14, 16. The resultant structure provides PSG sidewall layers on opposite sides of the metallization structure, in contact with the conductor and barrier metal sidewalls and with the substrate surface 13 adjacent the edges of barrier metal layer 14. Although shown in the Figures as having a generally rectangular shape, the metallization structure as actually fabricated and appearing in cross section in photomicrographs reveals a more rounded shape, in which the PSG side wall layers 18a are crescent shaped, with one end contacting both the edge 15 of the barrier metal layer 14 and the surface 13 of the field oxide.

Figure 3:
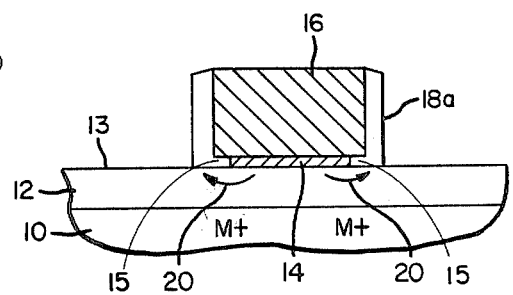
FIG. 3 illustrates the step of annealing the structure of FIG. 2.

Referring to FIG. 3, the structure fabricated in FIGS. 1 and 2 is subjected to a heat treatment or annealing step. Annealing at sufficient temperature mobilizes any contaminant sodium ions in the barrier metal and causes such ions to out-diffuse into adjacent materials, including the gettering composition, where they react and bond within the gettering medium. A substantial proportion of the sodium ions, that would otherwise diffuse into the field oxide layer and migrate during circuit operation to the field oxide-silicon interface, are thus absorbed by the gettering composition. The annealing temperature must not be so high as to damage the circuit but may otherwise be within the ranges of temperature ordinarily used in processing integrated circuits. This temperature cannot be much above 400° C. for gold metallization, but can be higher for the other conductor metals. Experimentally, it has been determined that annealing a chip containing the above-described gold/Ti:W/PSG structure at about 400° C. for about 30 minutes is sufficient to out-diffuse a sufficient amount of mobile contaminant metal ions ($Na+$) from the barrier metal layer 14 and adjoining portions of the field oxide 12 to obtain a field voltage shift within acceptable limits (less that 500 millivolts per 1000 Å of field oxide thickness). Annealing need not be performed as a separate step if subsequent processing of the integrated circuit includes annealing at about 400° C. or more and for about 30 minutes or longer.

Figure 4:
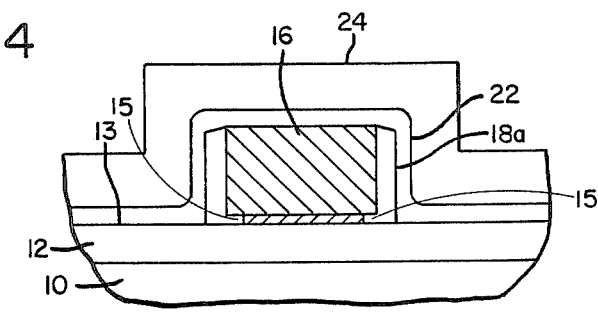
FIG. 4 shows the steps of depositing and adhering an insulative layer over the metallization structure formed in FIGS. 1-3.

Referring to FIG. 4, a layer 22 of silicon nitride ($Si_3N_4$) is deposited by plasma enhanced chemical vapor deposition over the field oxide, the PSG sidewall layers 18a and the exposed top surface of the gold layer 16. Layer 22 is deposited to a thickness in the range of 170-270 Å, and preferably of about 250 Å. Silicon nitride is itself insulative, but is primarily provided as an adhesion layer. Next, an insulative oxide ($SiO_2$) layer 24 is deposited over the nitride layer 22. The oxide layer is preferably deposited by plasma enhanced chemical vapor deposition to a thickness of about 7,500 Å.

As mentioned above, adhesion of PSG to gold is generally poor. Nevertheless, depositing the nitride layer 22 in contact with PSG sidewall layers 18a and the exposed upper surface of gold layer 16 provides good adhesion of insulative oxide layer 24. The structural integrity of the contiguous oxide layer and adhesion of such layer to the gold retains the PSG sidewalls in contact with the metallization structure, as has been demonstrated in cross-sectioning integrated circuits fabricated in accordance with the foregoing procedure.

Tests of integrated circuits constructed as described above have demonstrated a significant reduction of field voltage shift from similarly-constructed circuits without the gettering composition sidewall layers. In one series of comparative tests the nongettered structure had an average field threshold voltage shift of 1.4 volts per 1000 Å, and a range of 1.17 to 2.16 volts per 1000 Å. Test circuits identically fabricated except using the gettering-metallization structure of the invention exhibited an average field threshold voltage shift of 380 millivolts per 1000 Å of oxide thickness and a range of 270 to 480 millivolts per 1000 Å. For a field oxide thickness of 9000 Å, this range typically provides an inversion voltage greater than 15 volts.

Besides greatly improved operating characteristics of the resultant structure, the method of the invention provides easy self-alignment of the gettering material with the major source of mobile ion contamination (i.e., the barrier metal), requires no additional photolithography and is compatible with prior, conventional integrated circuit processes. Moreover, it makes possible extending conventional metallization methods to new families of devices, such as CMOS integrated circuitry.

Having illustrated and described the principles of our invention in a preferred embodiment, it should be apparent to those skilled in the art that the invention can be modified in arrangement and detail without departing from such principles. We claim all modifications coming within the scope and spirit of the following claims.

We claim:

1. In an integrated circuit fabrication process, a method of making a multi-layer metallization structure including a conductor metal and a barrier metal comprising a composition of titanium-tungsten which includes an amount of contaminant sodium ions, the method comprising:

depositing a layer of the barrier metal on a surface of a semiconductor substrate;

depositing a layer of the conductor metal on the barrier metal layer, the barrier metal layer separating the conductor metal from said surface;

patterning the conductor and barrier metal layers to define said structure along the substrate surface as a predetermined pattern of conductive interconnects and gate contacts having a pair of opposite sidewalls;

depositing a layer of a gettering composition over the substrate including in contact with each of the sidewalls of the metallization structure, the gettering composition being selected to react with and bind any of the contaminant sodium ions coming in contact therewith;

selectively removing a portion of the gettering composition layer to expose a top surface of the conductor metal layer while leaving a sidewall portion of the gettering composition layer contacting the substrate along each of the sidewalls of the metallization structure;

removing a portion of the contaminant sodium ions from the barrier metal so as to reduce the amount of said ions available to contaminate the semiconductor substrate; and depositing and adhering a layer of an insulative material onto the exposed conductor metal and the sidewall layers of the gettering composition.

2. A method according to claim 1 including selectively etching the barrier metal after deposition of the conductor metal and patterning so as to form the sidewalls of the metallization structure with a recess adjacent the substrate surface, and chemical vapor depositing the gettering composition.

3. A method according to claim 1 in which the gettering composition is phosphorus-silicate glass.

4. A method according to claim 1 in which the step of depositing and adhering an insulative layer includes depositing a layer of silicon nitride upon and in contact with the exposed conductor metal and the sidewall portions of the gettering composition.

5. A method according to claim 4 including depositing a layer of silicon oxide onto the layer of silicon nitride.

6. A method according to claim 1 in which the conductor metal is an alloy comprising a noble metal.

7. A method according to claim 6 in which the noble metal is gold.

8. A method according to claim 1 in which the step of selectively removing includes anisotropically etching the gettering composition layer.

9. A method according to claim 1 in which the gettering composition layer is a phosphorus-silicate glass and the step of selectively removing includes reactive ion etching said layer.

10. A method according to claim 1 in which the removing step includes annealing the circuit to mobilize said metal ions and cause a migration thereof into contact with the gettering composition sidewall layers.

11. A method according to claim 10 in which the substrate is annealed at about 400° C. for about 30 minutes.

12. In an integrated circuit fabrication process, a method of making a multi-layer metallization structure including a conductor metal and a barrier metal comprising a composition of titanium-tungsten which includes an amount of contaminant sodium ions, the method comprising:

depositing a layer of the barrier metal on a surface of a semiconductor substrate;

depositing a layer of the conductor metal on the barrier metal layer, the barrier metal layer separating the conductor metal from said surface;

patterning the conductor and barrier metal layers to define said structure along the substrate surface as a predetermined pattern of conductive interconnects and gate contacts having a pair of opposite sidewalls;

depositing a layer of a gettering composition over the substrate including in contact with each of the sidewalls of the metallization structure, the gettering composition being selected to react with and bind any of the contaminant sodium ions coming in contact therewith;

selectively removing a portion of the gettering composition layer to expose a top surface of the conductor metal layer while leaving a sidewall portion of the gettering composition layer contacting the substrate along each of the sidewalls of the metallization structure;

annealing the circuit to mobilize said sodium ions and caues a migration thereof into contact with the gettering composition sidewall portions so as to reduce the amount of sodium ions available to contaminate the semiconductor substrate; and depositing and adhering a layer of an insulative material onto the exposed conductor metal and the sidewall portions of the gettering composition.

13. An integrated circuit process according to claim 12 in which the gettering composition is phosphorus-silicate glass, the depositing and adhering step including depositing an adhesion layer of silicon nitride onto the exposed conductor metal and the phosphorus-silicate glass sidewalls and depositing an insulative silicon dioxide layer onto the silicon nitride layer.

14. An integrated circuit process according to claim 12 including annealing the substrate for a duration and at a temperature sufficient to reduce field voltage shift to a range less than 500 millivolts per 1000 Å of thickness of the insulative material.

15. An integrated circuit process according to claim 14 in which the annealing duration is about 30 minutes at a temperature of about 400° C.

* * * * *